US006903670B1

United States Patent
Lee et al.

(10) Patent No.: US 6,903,670 B1
(45) Date of Patent: Jun. 7, 2005

(54) CIRCUIT AND METHOD FOR CANCELLATION OF COLUMN PATTERN NOISE IN CMOS IMAGERS

(75) Inventors: Hae-Seung Lee, Bedford, MA (US); Keith Glen Fife, Stanford, CA (US)

(73) Assignee: SMaL Camera Technologies, Cambridge, MA (US)

(*) Notice: Subject to any disclaimer, the term of this patent is extended or adjusted under 35 U.S.C. 154(b) by 0 days.

(21) Appl. No.: 10/679,755

(22) Filed: Oct. 6, 2003

Related U.S. Application Data

(60) Provisional application No. 60/416,043, filed on Oct. 4, 2002.

(51) Int. Cl.[7] ............................................. H03M 1/06
(52) U.S. Cl. ..................... 341/118; 341/120; 348/180; 348/241; 348/301; 348/302; 348/308
(58) Field of Search .............................. 341/118–122; 348/180, 241, 301–302, 308; 250/208.01

(56) References Cited

U.S. PATENT DOCUMENTS

| | | | |
|---|---|---|---|
| 4,317,134 A | 2/1982 | Woo et al. | |
| 4,656,503 A | 4/1987 | Hynecek | |
| 4,942,474 A | 7/1990 | Akimoto et al. | |
| 4,987,321 A | 1/1991 | Toohey | |
| 5,034,633 A | 7/1991 | Stekelenburg | |
| 5,187,583 A | 2/1993 | Hamasaki | |
| 5,204,761 A | 4/1993 | Gusmano | |
| 5,296,696 A | 3/1994 | Uno | |
| 5,317,406 A | * 5/1994 | Kobayashi et al. | ......... 348/307 |

(Continued)

OTHER PUBLICATIONS

"Autobrite: Method for controlling the dynamic range of an image sensor."*SMAL Camera Technologies*. Dec. 7, 2001.
"A 256 X 256 CMOS Imaging Array with Wide Dynamic Range Pixels and Column–Parallel Digital Output," Decker et al. *IEEE Journal of Solid–State Circuits*, Dec. 1998. vol. 33, No. 12.

*Primary Examiner*—Michael Tokar
*Assistant Examiner*—Khai Nguyen
(74) *Attorney, Agent, or Firm*—Gauthier & Connors

(57) ABSTRACT

A circuit and method measure the output voltage of a CMOS pixel in a manner that substantially reduces all columnar pattern noise due to mismatches in the signal processing circuits including the correlated double sampling amplifiers and A/D converters. The circuit includes a test switch, operatively connected between a reference voltage source and a correlated double sampling amplifier, for applying a test voltage from the reference voltage source when the state of the test switch is ON to the correlated double sampling amplifier. The reference voltage source produces a voltage corresponding to a full-scale voltage level to enable the determination of a gain error in the correlated double sampling amplifier and/or A/D converter; a voltage corresponding to ground to enable the determination of an offset error in the correlated double sampling amplifier and/or A/D converter; and a plurality of analog voltages ranging from analog ground to a full-scale voltage level to enable the determination of non-linearity errors in the A/D converter.

12 Claims, 3 Drawing Sheets

U.S. PATENT DOCUMENTS

| | | |
|---|---|---|
| 5,434,619 A | 7/1995 | Yonemoto |
| 5,471,515 A | 11/1995 | Fossum et al. |
| 5,488,415 A | 1/1996 | Uno |
| 5,512,750 A | 4/1996 | Yanka et al. |
| 5,519,441 A | 5/1996 | Gusmano et al. |
| 5,576,763 A | 11/1996 | Ackland et al. |
| 5,608,345 A | 3/1997 | Macbeth et al. |
| 5,625,412 A | 4/1997 | Aciu et al. |
| 5,631,704 A | 5/1997 | Dickinson et al. |
| 5,698,844 A | 12/1997 | Shinohara et al. |
| 5,708,471 A * | 1/1998 | Okumura .................... 348/301 |
| 5,717,458 A | 2/1998 | Yonemoto |
| 5,739,562 A | 4/1998 | Ackland et al. |
| 5,742,047 A | 4/1998 | Buhler et al. |
| 5,754,224 A | 5/1998 | Kusaka |
| 5,877,715 A * | 3/1999 | Gowda et al. .............. 341/122 |
| 5,965,871 A | 10/1999 | Zhou et al. |
| 6,067,113 A | 5/2000 | Hurwitz et al. |
| 6,133,862 A * | 10/2000 | Dhuse et al. ................ 341/118 |
| 6,320,616 B1 | 11/2001 | Sauer |
| 6,366,312 B1 * | 4/2002 | Crittenden .................. 348/187 |
| 6,473,124 B1 | 10/2002 | Panicacci et al. |
| 6,483,541 B1 * | 11/2002 | Yonemoto et al. .......... 348/302 |
| 6,587,142 B1 | 7/2003 | Kozlowski et al. |
| 6,642,494 B1 * | 11/2003 | Endo ........................ 250/208.1 |
| 6,703,959 B2 * | 3/2004 | Kuwabara ................... 341/155 |
| 6,734,897 B1 * | 5/2004 | Mentzer ..................... 348/180 |
| 6,747,695 B1 * | 6/2004 | Afghahi ..................... 348/241 |
| 2001/0040635 A1 | 11/2001 | Fossum et al. |
| 2002/0100862 A1 | 8/2002 | Liu |
| 2003/0025817 A1 | 2/2003 | Yonemoto et al. |
| 2003/0076431 A1 | 4/2003 | Krymski |

* cited by examiner

CIRCUIT AND METHOD FOR CANCELLATION OF COLUMN PATTERN NOISE IN CMOS IMAGERS

PRIORITY INFORMATION

This application claims priority from U.S. Provisional Patent Application, Ser. No. 60/416,043, filed on Oct. 4, 2002. The entire contents of U.S. Provisional Patent Application, Ser. No. 60/416,043 are hereby incorporated by reference.

FIELD OF THE PRESENT INVENTION

The present invention relates to imaging devices and, in particular, to complementary metal-oxide semiconductor (CMOS) image sensors with reduced fixed pattern noise.

BACKGROUND OF THE PRESENT INVENTION

Various types of imagers or image sensors are in use today, including charge-coupled device (CCD) image sensors and complementary metal-oxide semiconductor CMOS image sensors. CMOS image sensors typically utilize an array of active pixel image sensors and a row or register of correlated double-sampling circuits or amplifiers to sample and hold the output of a given row of pixel image sensors of the array. Each active pixel image sensor of the array of pixels typically contains a pixel-amplifying device (usually a source follower).

CMOS image sensors have several advantages over CCD image sensors. For example, CCD image sensors are not easily integrated with CMOS process peripheral circuitry due to complex fabrication requirements and relatively high cost. However, since CMOS image sensors are formed with the same CMOS process technology as the peripheral circuitry required to operate the CMOS image sensor, such sensors are easier to integrate into a single system-on-chip using integrated circuit (IC) fabrication processes.

Moreover, by using CMOS image sensors, it is possible to have monolithic integration of control logic and timing, image processing, and signal-processing circuitry such as analog-to-digital (A/D) conversion, all within a single sensor chip. Thus, CMOS image sensors can be manufactured at low cost, relative to CCD image sensors, using standard CMOS IC fabrication processes.

Additionally, CCD image sensors typically require three different input voltages with separate power supplies to drive them. CCD images sensors also require relatively high power supply voltages and thus also require relatively high power to operate. By contrast, CMOS devices require only a single power supply, which may also be used to drive peripheral circuitry. This gives CMOS image sensors an advantage in terms of power consumption, and also in terms of the amount of chip area or "real-estate" devoted to power supplies.

CMOS image sensors have relatively low power requirements because of the relatively low voltage power supply required for operation, and also because only one row of pixels in the active pixel sensor array needs to be active during readout.

Despite these advantages, however, CMOS image sensors also have various disadvantages in comparison to CCD image sensors. For example, the quality of image obtained by a CMOS imager is in general poorer compared with that from a CCD imager. One of the contributing factors of poorer image quality in CMOS imagers is image pattern noise.

CMOS pattern noise is generally due to mismatches in the threshold voltages of the MOS transistors of a CMOS pixel, feedthrough of electronic charge, associated with the MOS pixel transistors, and mismatches in the processing circuits, including correlated double sampling amplifiers and analog-to-digital (A/D) converters.

The fixed pattern noise due to mismatches in the transistors' threshold voltages is typically removed by double sampling. Double-sampling of a CMOS pixel output at different times during the pixel reset and integration periods is a well-known technique often employed for correcting for the fixed pattern noise caused by CMOS transistor threshold voltage mismatch. This technique enables a determination of the extent of a pixel output that is due to fixed pattern noise, such that simple subtraction of a pixel reset value from a pixel output value at the end of an integration period removes the fixed pattern noise that stems from threshold voltage mismatches.

Typically such subtraction is carried out in the analog domain by the correlated double sampling amplifier or correlated double sampling circuit, or in the digital domain by a digital processing circuit. An analog subtraction technique using the correlated double sampling amplifier is typically carried out in two phases. During the first phase, the correlated double sampling amplifier samples the pixel output voltage level at the end of an integration period. The pixel output voltage sampled at this time is the sum of the reset value of the pixel and the response of the pixel to the incident light during the integration period. During the second phase, the pixel reset value is measured and subtracted from the previously sampled pixel output voltage by the correlated double sampling amplifier. The resulting output voltage from the correlated double sampling contains, to the first order, only the response to the incident light, if the correlated double sampling amplifier contributes no error.

The fixed pattern noise that is a result of feedthrough can similarly be removed by a noise compensation technique. However, both threshold mismatch and feedthrough noise compensation techniques do not remove image pattern noise that is due to mismatches in the processing circuits themselves. The image pattern noise due to mismatches in the processing circuits typically has a columnar structure, and is more highly objectionable to human visualization than the random pixel-to-pixel fixed pattern noise due to threshold mismatches and feedthrough.

More specifically, in conventional CMOS image sensor architecture, a selected or active row of active pixel sensors is read out in parallel to the row of correlated double sampling circuits during a row period. The output of the row of correlated double sampling circuits is then scanned rapidly by a horizontal shift register to read the line out to a common output port, thus any mismatch between the correlated double sampling circuits results in a column fixed pattern noise artifact in the captured image.

Such mismatches are typically caused by different DC offsets and gains in the signal amplification and processing provided by the correlated double sampling circuits. The fixed pattern noise artifacts produced by CMOS image sensors are typically very visible since they are not randomly distributed across the image, but are lined up on a column-by-column basis.

Most CMOS imagers employ column-parallel signal processing circuits that include double-sampling amplifiers and A/D converters, as described above. Typically, a single correlated double sampling amplifier sequentially samples the outputs of pixels that are situated in a common column. Thus, there is typically the same number of correlated double sampling circuits as the number of columns in a CMOS imager. The outputs of a number of correlated double sampling amplifiers are typically subsequently multiplexed to one A/D converter and converted to digital data.

FIG. 1 schematically illustrates, in block diagram form, a typical prior art CMOS imager 1 with column-based signal processing circuits 2. In this example, each column of pixels (5, 6, . . . , 10 & 12) has an associated correlated double sampling amplifier (7, 9, . . . , 11 & 13), and the outputs from two adjacent correlated double sampling amplifiers (7 & 9 or 11 & 13) are processed by an A/D converter (19 & 21, respectively) after being multiplexed by a multiplexer (15 & 17, respectively).

In general, a row of pixels is selected when the row select signal for that particular row, where the rows range from 1 to n, is set "high." For example, as illustrated in FIG. 1, a row of pixels (5, 6, . . . , 10 & 12) is selected when the row select signal, $RS_1$, 3 is set "high." When $RS_1$ 3 is "high," the pixels (5, 6, . . . , 10 & 12) are selected and the output of each pixel is connected to the input of a corresponding correlated double sampling amplifier (7, 9, . . . , 11 & 13) for the column in which that pixel is situated. As explained previously, mismatches in electrical characteristics among correlated double sampling amplifiers and A/D converters cause column pattern noise in the resulting image.

The resulting column pattern noise is because the electrical characteristics of the individual correlated double sampling amplifiers and A/D converters may be slightly different, due, e.g., to component mismatches. For example, correlated double sampling amplifiers may have different offset voltages due to mismatches in charge injection during the sampling process of the pixel output voltage. This means that the output values of all pixels in one column will have an offset due to the correlated double sampling amplifier of that column, while the output values of all pixels in the next column may have another offset due to the corresponding correlated double sampling amplifier for that pixel column.

The resulting image will include non-uniform column brightness, e.g., including darker and brighter columns across the image. The offset characteristic of each column is in general fixed, whereby the resulting highly-structured columnar imager noise pattern does not change with time. Such column pattern noise is visually prominent even when the difference in offset between adjacent pixel columns is very minute, e.g., one milli-volt or less.

Offset errors in the A/D converters manifest themselves similarly; with the exception that a number of columns processed by the same A/D converter appear grouped together. Gain mismatch among correlated double sampling amplifiers or A/D converters also produces column pattern noise. Since the error due to gain mismatch is a linear function of the input light intensity, the resulting column pattern noise is not fixed, but varies with input light intensity. Errors in A/D converter conversion linearity can also give rise to similar column pattern noise.

The image column pattern noise described above is especially noticeable when the scene to be imaged is relatively dark; in this case, the outputs of the imager pixels are often "gained up," or amplified, to make the image brighter. In this case, the column pattern noise is also gained up by the same factor, making it more noticeable. Since the error due to gain mismatches among correlated double sampling amplifiers or A/D converters and the linearity errors in A/D converters are small when the intensity is low, the column pattern noise is here generally dominated by offset errors in correlated double sampling amplifiers and A/D converters. As stated previously, the offset errors contribute fixed-pattern noise that does not depend on the intensity of input light.

To compensate for this fixed pattern noise, it has been proposed that fixed pattern noise be reduced on a pixel-by-pixel basis. In such a compensation technique, calibration is carried out in which the dark offset of each pixel is determined under dark conditions and stored in a frame memory, later to be subtracted from images, pixel-by-pixel, once the image data from the pixels have been collected.

Although this technique does enable correction of the dark offset caused by both charge feedthrough and processing circuit mismatches, it requires the application of a calibration factor to the post-processing of images, thereby requiring extensive hardware. In addition, this proposed compensation process requires means for blocking input light, such as a mechanical shutter, so as to acquire the dark image. This further modification adds substantial cost to the camera system. As a result, for many applications, even this pattern noise compensation technique cannot be employed, and in general, compensation for non-fixed, gain-dependent cannot be achieved.

Therefore, it is desirable to provide a fixed pattern noise compensation technique that can compensate for gain and dark offset without requiring the post-processing of images. Moreover, it is desirable to provide a fixed pattern noise compensation technique that can compensate for gain and dark offset without requiring additional features, such as mechanical shutters that can add significant costs to the imaging system.

SUMMARY OF THE PRESENT INVENTION

A first aspect of the present invention is a method for compensating non-linearity errors in A/D converter conversion operations associated with converting analog image data from a CMOS imager to digital data. The method isolates an A/D converter from the CMOS imager; applies a plurality of analog voltages to the isolated A/D converter, the plurality of voltages ranging from analog ground to a full-scale voltage level; measures and stories a difference between an output from the isolated A/D converter and a reference value associated with the analog voltage being applied to the isolated A/D converter; and corrects the non-linearity of the isolated the isolated A/D converter using the stored difference.

A second aspect of the present invention is a circuit for compensating errors in correlated double sampling amplifiers and/or A/D converters associated with a CMOS imager having columns of pixels. The circuit includes a reference voltage source to produce test voltages; a test switch operatively connected between the reference voltage source and a correlated double sampling amplifier; a test switch control line, operatively connected to the test switch, to apply a signal to the test switch, the signal controlling an ON/OFF state of the test switch, the test switch applying a test voltage from the reference voltage source to the correlated double sampling amplifier when the state of the test switch is ON; and a measurement circuit to measure a difference between an output of the A/D converter produced from a test voltage being applied to the correlated double sampling amplifier through the test switch and a reference voltage associated with the applied test voltage to determine an error in the correlated double sampling amplifier and/or A/D converter.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
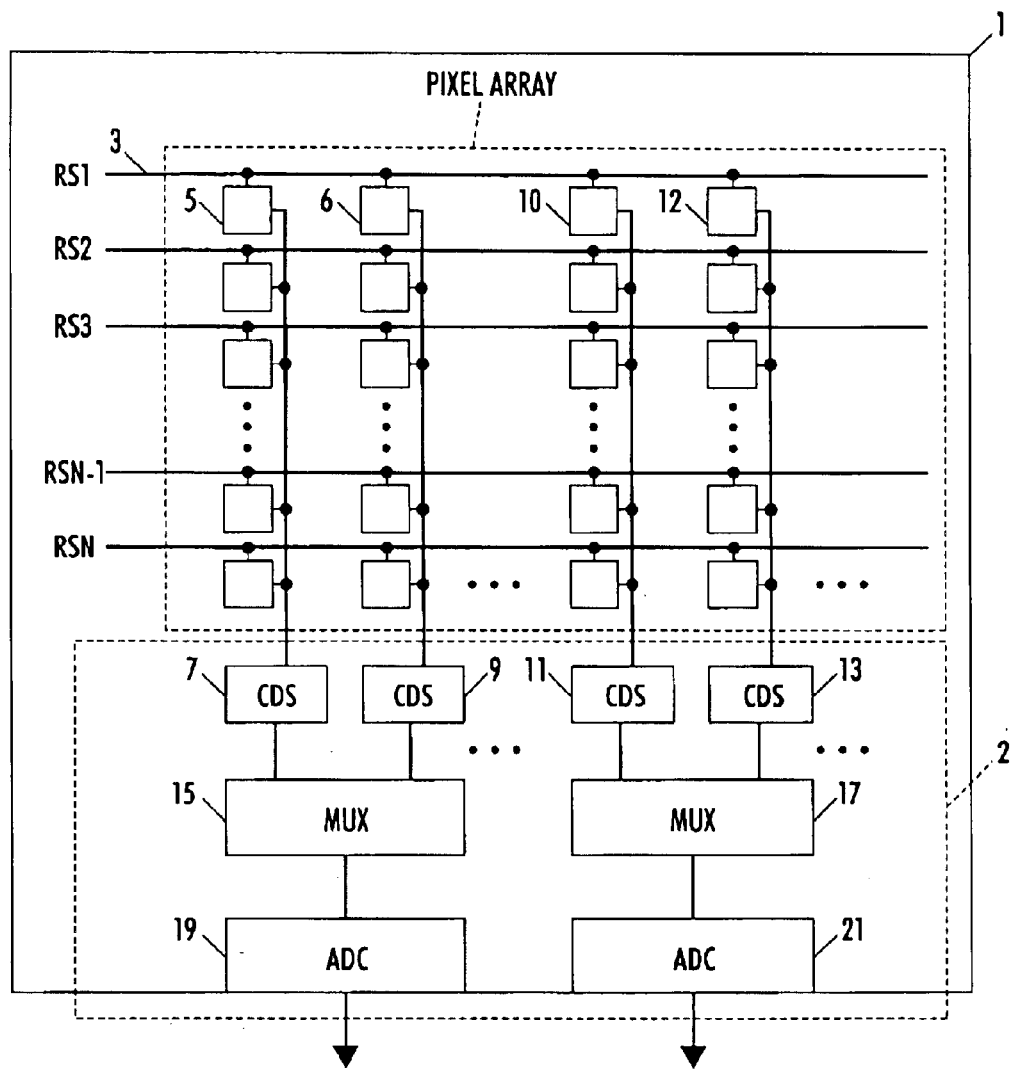
FIG. 1 is block diagram illustrating a prior art CMOS imager.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference numbering has been used throughout to designate identical or equivalent elements. It is also noted that the various drawings illustrating the present invention are not drawn to scale and that certain regions have been purposely drawn disproportionately so that the features and concepts of the present invention could be properly illustrated.

Figure 2:
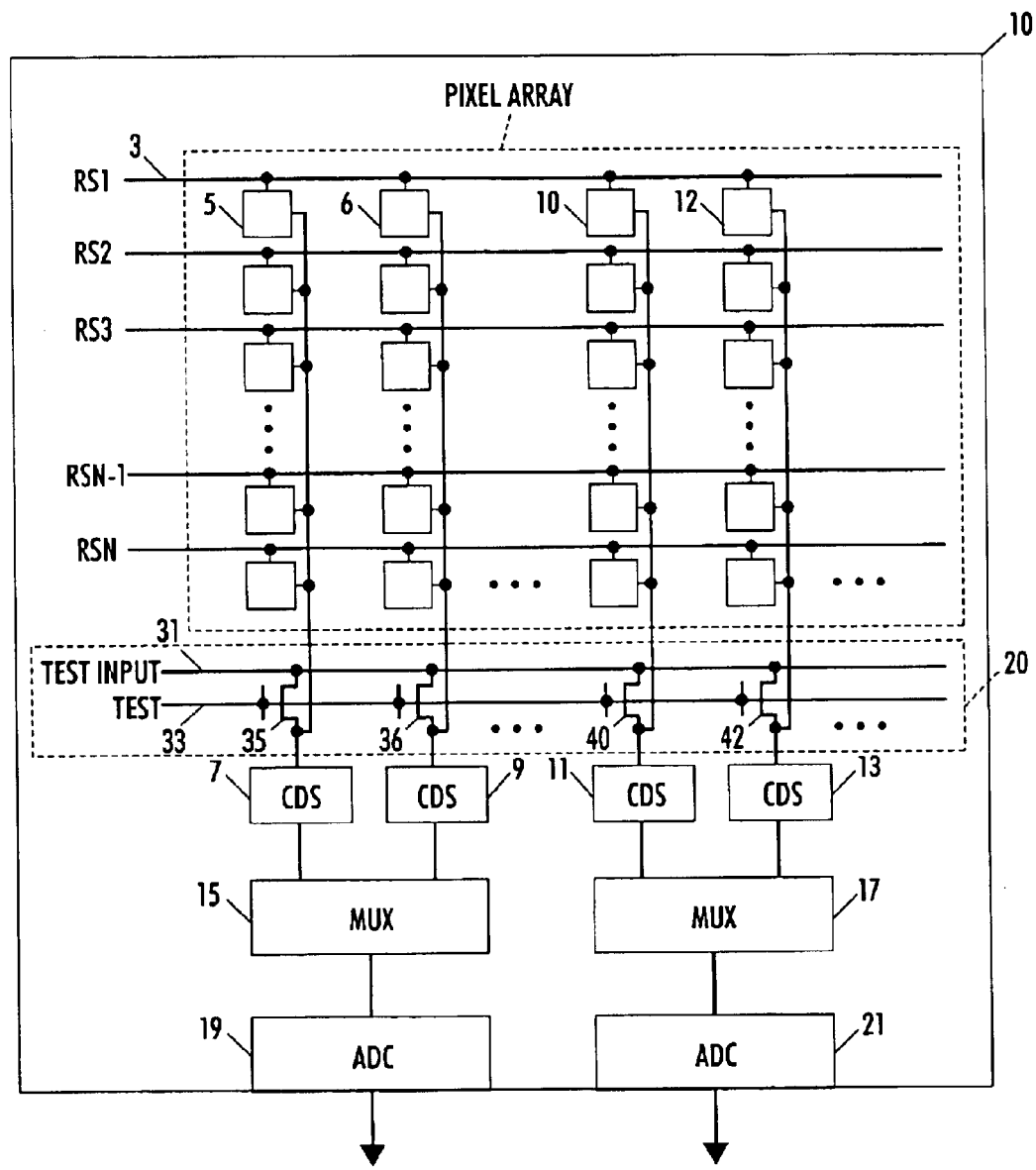
FIG. 2 is a block diagram illustrating one embodiment of a CMOS imager according to the concepts of the present invention.

In accordance with the concepts of the present invention, FIG. 2 schematically illustrates a CMOS imager 10 of the invention including column pattern noise compensation circuitry 20. Specifically, as illustrated in FIG. 2, the column pattern noise compensation circuitry 20 includes a plurality of TEST MOS transistors (35, 36, . . . , 40 & 42) wherein each TEST MOS transistor (35, 36, . . . , 40 & 42) is associated with a column of pixels (5, 6, . . . , 10 & 12) and the input of a correlated double sampling amplifier (7, 9, . . . , 11 & 13) for the imager array 10.

The TEST MOS transistors (35, 36, . . . , 40 & 42) function as analog switches, and in some applications it can be provided as complementary CMOS switches consisting of a parallel connection of an NMOS and a PMOS transistor. The TEST MOS analog switches (35, 36, . . . , 40 & 42) allow the testing and calibration of the correlated double sampling amplifiers (7, 9, . . . , 11 & 13) and the A/D converters (19 & 21) in a manner that enables compensation for column pattern noise.

According to the concepts of the present invention, a correlated double sampling amplifier-A/D converter (CDSAADC) test mode is activated. The CDSAADC test mode is activated by setting all row select signals, $RS_1$–$RS_N$, for all rows of a pixel array, "low" and setting TEST signal 33 "high." By setting all row select signals, $RS_1$–$RS_N$, for all rows of a pixel array, "low," all pixel outputs are disconnected from the inputs of correlated double sampling amplifiers (7, 9, . . . , 11 & 13). Moreover, by setting TEST signal 33 "high," TEST MOS transistors (35, 36, . . . , 40 & 42) are turned ON so that "test input" signal 31 can be applied to the inputs of all the correlated double sampling amplifiers (7, 9, . . . , 11 & 13). In this way, the present invention can determine the combined offset errors of the correlated double sampling amplifier and the A/D converter of a column for each column in the array simultaneously as follows.

During a first CDSAADC test mode phase corresponding to a pixel output measurement phase, a known reference signal, preferably analog ground, is applied as the 'test input' voltage, as "test input" signal 31. Thereafter, during a second CDSAADC test mode phase corresponding to a reset measurement phase, the "test input" voltage is set to a known voltage that is above a reference level. The known voltage preferably is positive and is larger than the reference level by an amount corresponding to the largest expected combined correlated double sampling amplifier A/D converter offset. For example, if the expected peak-to-peak range of the combined correlated double sampling amplifier A/D converter offset is –10 mV to +10 mV, the "test input" can be set at analog ground during the first phase, and set at about +10 mV during the second phase.

If there were no offset in any of the correlated double sampling amplifiers and/or A/D converters of the array, the digital outputs of all A/D converters would correspond to the +10 mV analog "test input." Any deviation from this value indicates a column offset that is attributable to the correlated double sampling amplifiers and/or A/D converters.

It is noted that uniform offset between columns does not contribute to column pattern noise, but deviation in offset from column to column does cause pattern noise. Thus, utilizing the above-described technique according to the concepts of the present invention, it can be determined if there exists an offset from column to column at the A/D converter outputs for the array columns.

The two-phase test procedure of the present invention can be carried out in a range of techniques. For example, multiple test measurements of the same column offset error can be taken and the multiple measurements averaged to produce an average column offset. Preferably the number of measurements to be averaged is a power of 2, whereby a simple shift operation can be employed for the division step required to produce the average value.

The deviation of a subsequently measured offset for a given column from the calculated mean of that column's offset is then stored in memory, e.g., RAM or FLASH memory. The stored data for each column is then recalled during the normal operation of the imager, and subtracted or added to the output of the A/D converter for that column, depending on the polarity of the error from the A/D converter outputs. This effectively cancels or compensates for the offset errors found to exist during the normal operation of the imager. An arithmetic logic unit or other processor can be employed to impose the offset compensation addition or subtraction.

In a further example test procedure, an offset measurement for each column of the array can be averaged together, column-wise, to produce an average column offset for the array. More than one measurement can be made for each column in the manner described above. With an average column offset for the array produced, a subsequent measurement of offset for each column can be compared to this array average, for storage of the difference between each column's offset and the average column offset of the array. The resulting offset difference can then be imposed on the column output in the compensation step as described above.

The two-phase test procedure and storage of calibration data can be carried out during any convenient imager operational period when the signal chain of correlated double samplings and/or A/D converters is not busy processing pixel array output data. For example, the two-phase test procedure and storage of calibration data of the present invention can be completed during initial power up of the imager array, upon wake-up from a suspended operation of the imager, and/or between the imager array frame periods.

The offset calibration data can be determined once, e.g., at the time of imager array power up, for use with each frame of data. Alternatively, new calibration data can be determined, e.g., after each frame, for use with a next subsequent frame or frames. In addition, a running average of offset data can be employed, e.g., by adding after each frame a new item or items of offset test data to an average offset value for a column or for the entire array. This enables minimization of the time needed to build a mean offset value between frames.

In accordance with the present invention, gain mismatch between the correlated double sampling amplifier and A/D converter signal chains of columns in an imager array can be measured and corrected for in a similar fashion. According to the concepts of the present invention, during the first phase of the CDSAADC test mode, a known reference signal, preferably analog ground, is applied as the "test input" voltage as before. Then during the second phase of the CDSAADC test mode the "test input" voltage is set to a known voltage that is below the full-scale voltage level ($V_{REF}$). For example, if the expected peak-to-peak range of the gain error is +−0.1%, with a full-scale voltage $V_{REF}$=1 volt, then the "test input" can be set at analog ground during the first phase, and then at about 0.999 V during the second phase.

If there were no gain mismatch in the correlated double sampling amplifiers and the A/D converters, the digital outputs of all the A/D converters would correspond to 0.999 V. Any deviation from this value represents the gain error contributed by the correlated double sampling amplifier and/or the A/D converter.

Again, it is noted that uniform gain error from column to column does not contribute pattern noise, but deviation in gain error between columns does cause pattern noise.

In the manner described above, multiple measurements of column gain error can be taken and the measurements averaged to produce an average column gain error. The deviation of a subsequently measured column gain error from the mean column gain error is then stored in memory, in the manner described above. The stored data can then be recalled during the normal operation of the imager, multiplied with the A/D converter outputs, and then subtracted or added from the A/D converter outputs depending on the polarity of gain errors. This cancels gain errors found to exist during the normal operation of the imager.

Any non-linearity error in the A/D converters conversion operations can also be compensated for in a similar fashion in accordance with the present invention. The "test input" in this case is swept from approximately analog ground to $V_{REF}$ during the second test phase. The differences in the A/D converter outputs are then recorded for use in correcting the non-linearity in the A/D converter conversion data during the normal operation of the imager. A few selected voltages near the major carry points; for example, 0.25 ($V_{REF}$), 0.5 ($V_{REF}$), and/or 0.75($V_{REF}$); can be applied sequentially as the "test input," rather than sweeping the "test input" during the second phase. This shortens the calibration measurement time, at the cost of the accuracy of non-linearity calibration.

Figure 3:
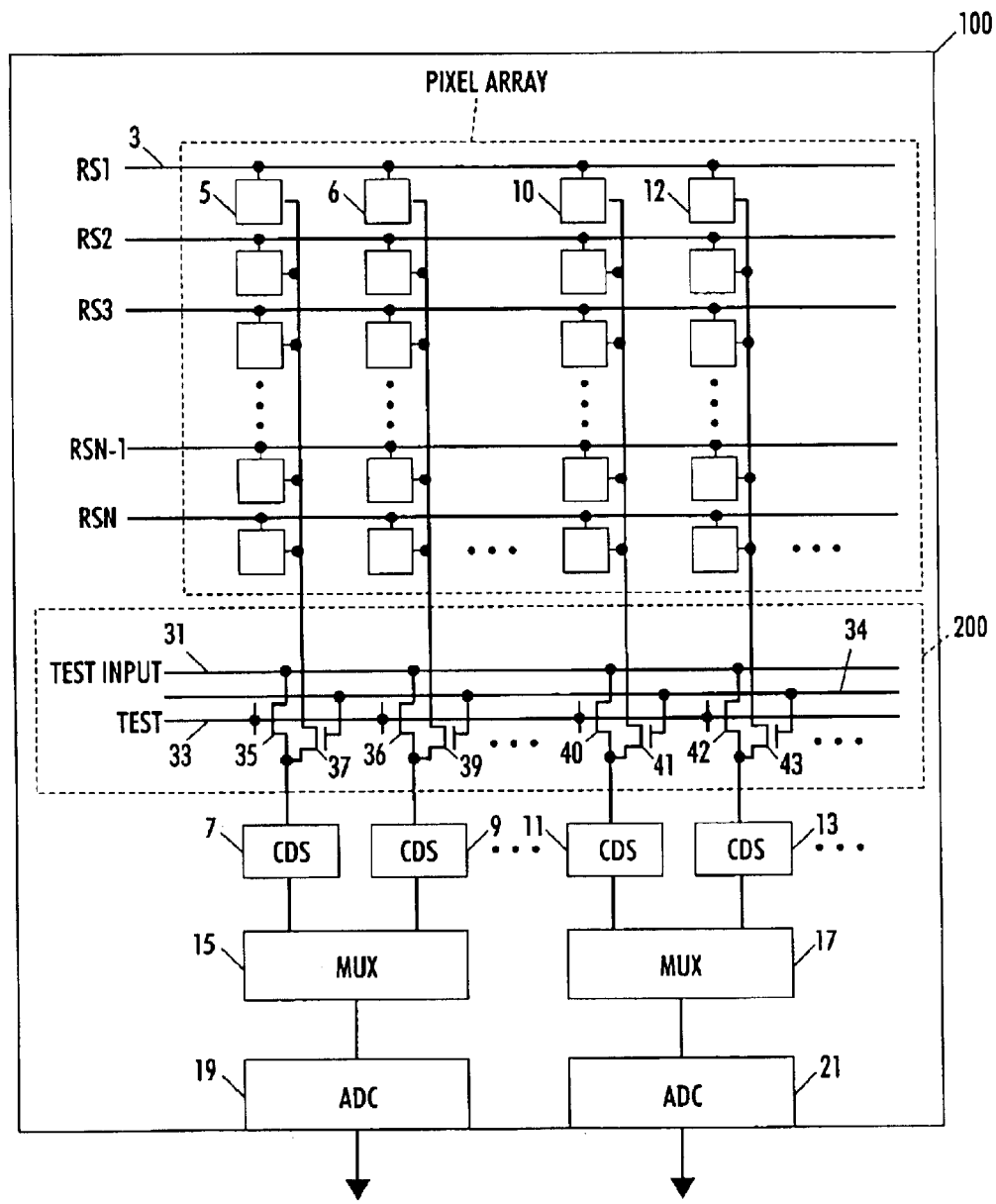
FIG. 3 is a block diagram illustrating another embodiment of a CMOS imager according to the concepts of the present invention.

In a second embodiment of the present invention, a CMOS imager 100 of the invention includes column pattern noise compensation circuitry 200. Specifically, as illustrated in FIG. 3, the column pattern noise compensation circuitry 200 includes a plurality of TEST MOS transistors (35, 36, . . . , 40 & 42) and a plurality of ISOLATION MOS transistors (37, 39, . . . , 41 & 43) wherein the ISOLATION transistors (37, 39, . . . , 41 & 43) are connected between a column of pixels (5, 6, . . . , 10 & 12) and the input of a correlated double sampling amplifiers (7, 9, . . . , 11 & 13) for the imager array 100. On the other hand, TEST MOS transistors (35, 36, . . . , 40 & 42) are connected between a test input signal line 31 and the input of a correlated double sampling amplifiers (7, 9, . . . , 11 & 13).

The TEST MOS transistors (35, 36, . . . , 40 & 42) and ISOLATION transistors (37, 39, . . . , 41 & 43) function as analog multiplexers, and in some applications it can be provided as complementary CMOS switches consisting of a parallel connection of an NMOS and a PMOS transistor. The MOS analog multiplexers allow the testing and calibration of the correlated double sampling amplifiers (7, 9, . . . , 11 & 13) and the A/D converters (19 & 21) in a manner that enables compensation for column pattern noise.

According to the concepts of the present invention, a correlated double sampling amplifier-A/D converter (CDSAADC) test mode is activated. The CDSAADC test mode is activated by setting ISOLATION signal 34, "low" and setting TEST signal 33 "high." In most cases, the isolation signal 34 can be the inverted TEST signal 33. Optionally, by setting all row select signals, $RS_1$-$RS_N$, for all rows of a pixel array, "low," all pixel outputs are disconnected from the inputs of correlated double sampling amplifiers (7, 9, . . . , 11 & 13). Moreover, by setting TEST signal 33 "high," TEST MOS transistors (35, 36, . . . , 40 & 42) are turned ON so that "test input" signal 31 can be applied to the inputs of all the correlated double sampling amplifiers (7, 9, . . . , 11 & 13). Also, by setting ISOLATION signal 34 "low," ISOLATION MOS transistors (37, 39, . . . , 41 & 43) are turned off to prevent any stray signals from the pixel array being applied to the inputs of all the correlated double sampling amplifiers (7, 9, . . . , 11 & 13), thereby preventing any stray signals from contaminating the calibration procedure.

This embodiment of the present invention can be utilized in the same fashion, as described above with respect to FIG. 2, to measure and compensate for the DC offset errors, gain errors, and non-linearity errors associated with the correlated double sampling amplifier and/or A/D converter, thereby effectively eliminating or reducing the fixed pattern noise.

It is further noted that the concepts of the present invention can be modified such that the set of test mode transistors can be placed between the multiplexers and the A/D converters to enable the non-linearity errors of the A/D converters without having the test signal pass through the correlated double sampling amplifiers or the multiplexers.

In summary, utilizing the circuitry and procedures described above, the present invention enables elimination of both fixed and varying column offset components, resulting in dramatic improvement in image quality but requiring only minimal additional circuitry and processing.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A method for compensating non-linearity errors in A/D converter conversion operations associated with converting analog image data from a CMOS imager to digital data, comprising:

(a) isolating an A/D converter from the CMOS imager;

(b) applying a plurality of analog voltages to the isolated A/D converter, the plurality of voltages ranging from analog ground to a full-scale voltage level;

(c) measuring and storing a difference between an output from the isolated A/D converter and a reference value associated with the analog voltage being applied to the isolated A/D converter; and (d) correcting the non-linearity of the isolated the isolated A/D converter using the stored difference.

2. The method as claimed in claim 1, wherein the plurality of applied analog voltages are analog ground, 0.25 of the full-scale voltage level, 0.5 of the full-scale voltage level, 0.75 of the full-scale voltage level, and the full-scale voltage level.

3. A circuit for compensating errors in correlated double sampling amplifiers and/or A/D converters associated with a CMOS imager having columns of pixels, comprising:

a reference voltage source to produce test voltages;

a test switch operatively connected between said reference voltage source and a correlated double sampling amplifier;

a test switch control line, operatively connected to said test switch, to apply a signal to said test switch, said signal controlling an ON/OFF state of said test switch, said test switch applying a test voltage from said reference voltage source to the correlated double sampling amplifier when the state of said test switch is ON; and a measurement circuit to measure a difference between an output of the A/D converter produced from a test voltage being applied to the correlated double sampling amplifier through said test switch and a reference voltage associated with the applied test voltage to determine an error in the correlated double sampling amplifier and/or A/D converter.

4. The circuit as claimed in claim 3, further comprising:

an isolation switch operatively connected between a column of pixels and an associated correlated double sampling amplifier to effectively electrically isolate the column of pixels from the associated correlated double sampling amplifier;

said isolation switch being in an OFF state when said test switch is in an ON state.

5. The circuit as claimed in claim 3, wherein said reference voltage source produces a voltage corresponding to a full-scale voltage level to enable said measurement circuit to determine a gain error in the correlated double sampling amplifier and/or A/D converter.

6. The circuit as claimed in claim 3, wherein said reference voltage source produces a voltage corresponding to ground to enable said measurement circuit to determine an offset error in the correlated double sampling amplifier and/or A/D converter.

7. The circuit as claimed in claim 3, wherein said reference voltage source produces a sequence of two voltages with a difference corresponding to a full-scale voltage level minus a predetermined maximum anticipated variation voltage to enable said measurement circuit to determine a gain error in the correlated double sampling amplifier and/or A/D converter.

8. The circuit as claimed in claim 7, wherein said predetermined maximum anticipated variation voltage corresponds to maximum gain variations.

9. The circuit as claimed in claim 3, wherein said reference voltage source produces a sequence of two voltages with a difference corresponding to a predetermined voltage to enable said measurement circuit to determine an offset error in the correlated double sampling amplifier and/or A/D converter.

10. The circuit as claimed in claim 9, wherein said predetermined voltage corresponds to maximum offset variations.

11. The circuit as claimed in claim 3, wherein said reference voltage source produces a plurality of analog voltages ranging from analog ground to a full-scale voltage level to enable said measurement circuit to determine non-linearity errors in the A/D converter.

12. The circuit as claimed in claim 3, wherein said reference voltage source produces a voltage corresponding to a full-scale voltage level to enable said measurement circuit to determine a gain error in the correlated double sampling amplifier and/or A/D converter;

said reference voltage source producing a voltage corresponding to ground to enable said measurement circuit to determine an offset error in the correlated double sampling amplifier and/or A/D converter; and said reference voltage source producing a plurality of analog voltages ranging from analog ground to a full-scale voltage level to enable said measurement circuit to determine non-linearity errors in the A/D converter.

* * * * *